US012784812B2

(12) United States Patent
Lo et al.

(10) Patent No.: US 12,784,812 B2
(45) Date of Patent: Nov. 3, 2026

(54) MEMORY PRECHARGE

(71) Applicant: Taiwan Semiconductor Manufacturing Company, Ltd., Hsinchu (TW)

(72) Inventors: Chi Lo, Hsinchu (TW); Chieh Lee, Hsinchu (TW); Yi-Ching Liu, Hsinchu (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 81 days.

(21) Appl. No.: 18/826,710

(22) Filed: Sep. 6, 2024

(65) Prior Publication Data

US 2026/0073970 A1 Mar. 12, 2026

(51) Int. Cl.
*G11C 11/4091* (2006.01)
*G11C 11/4094* (2006.01)
*G11C 11/4099* (2006.01)

(52) U.S. Cl.
CPC ...... *G11C 11/4091* (2013.01); *G11C 11/4094* (2013.01); *G11C 11/4099* (2013.01)

(58) Field of Classification Search
CPC ............ G11C 11/4091; G11C 11/4094; G11C 11/4099
USPC ........................................ 365/185.24, 185.25
See application file for complete search history.

(56) References Cited

U.S. PATENT DOCUMENTS

| | | | | |
|---|---|---|---|---|
| 6,522,594 B1 * | 2/2003 | Scheuerlein | G11C 7/067 365/206 |
| 7,558,134 B2 | 7/2009 | Kitagawa | |
| 7,616,471 B2 * | 11/2009 | Yamamura | G11C 11/22 365/65 |
| 8,339,884 B2 * | 12/2012 | Huang | G11C 7/067 365/205 |
| 2003/0043621 A1 * | 3/2003 | Wong | G11C 11/5642 365/185.03 |
| 2004/0156253 A1 * | 8/2004 | Proll | G11C 11/4094 365/203 |
| 2006/0215471 A1 | 9/2006 | Tran | |
| 2007/0206402 A1 * | 9/2007 | Liaw | G11C 13/0023 365/189.09 |
| 2007/0223297 A1 * | 9/2007 | Hirota | G11C 7/02 365/208 |
| 2008/0062792 A1 * | 3/2008 | Jung | G11C 7/12 365/205 |
| 2009/0190415 A1 | 7/2009 | Kim | |
| 2014/0140143 A1 * | 5/2014 | Yang | G11C 7/06 365/189.02 |
| 2017/0178745 A1 * | 6/2017 | Chen | G11C 17/18 |
| 2017/0309330 A1 * | 10/2017 | Pyo | G11C 13/004 |
| 2020/0303002 A1 * | 9/2020 | Miyazaki | G11C 13/0004 |
| 2021/0020226 A1 * | 1/2021 | Lim | G11C 13/003 |
| 2021/0074340 A1 * | 3/2021 | Tyagi | G11C 7/065 |

* cited by examiner

*Primary Examiner* — Michael T Tran
(74) *Attorney, Agent, or Firm* — Merchant & Gould P.C.

(57) ABSTRACT

The present disclosure describes a precharge circuit for a memory cell. In an example embodiment, a memory device comprises a memory array including a memory cell, a bit line connected to an output terminal of the memory cell, a reference bit line, and a sensing amplifier circuit coupled to the bit line and coupled to the reference bit line. The memory device further comprises a precharge circuit coupled to the bit line and the reference bit line.

20 Claims, 6 Drawing Sheets

MEMORY PRECHARGE

BACKGROUND

Memory cell structures include a one transistor and one capacitor (1T1C) memory cell. The capacitor stores the data bit (as a tiny amount of charge), and the transistor acts as a switch to access that charge. Dynamic Random Access Memory (DRAM) often uses this architecture. To read data from the memory cell, a sense amplifier is coupled to a bit line (BL) and a reference bit line (BLB) of the memory cell that then detects a small change in voltage between the BL and BLB. In operation, the bit lines BL and BLB are charged to a reference voltage (also referred to as a precharge voltage). A transistor of the memory cell is turned on allowing charge to flow to BL from the capacitor. The sense amplifier detects this voltage difference. Its cross-coupled inverters magnify the difference, quickly driving one of the bit lines high and the other low. Further, the amplified signal from the sensing amplifier is used to restore the original data back into the DRAM cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
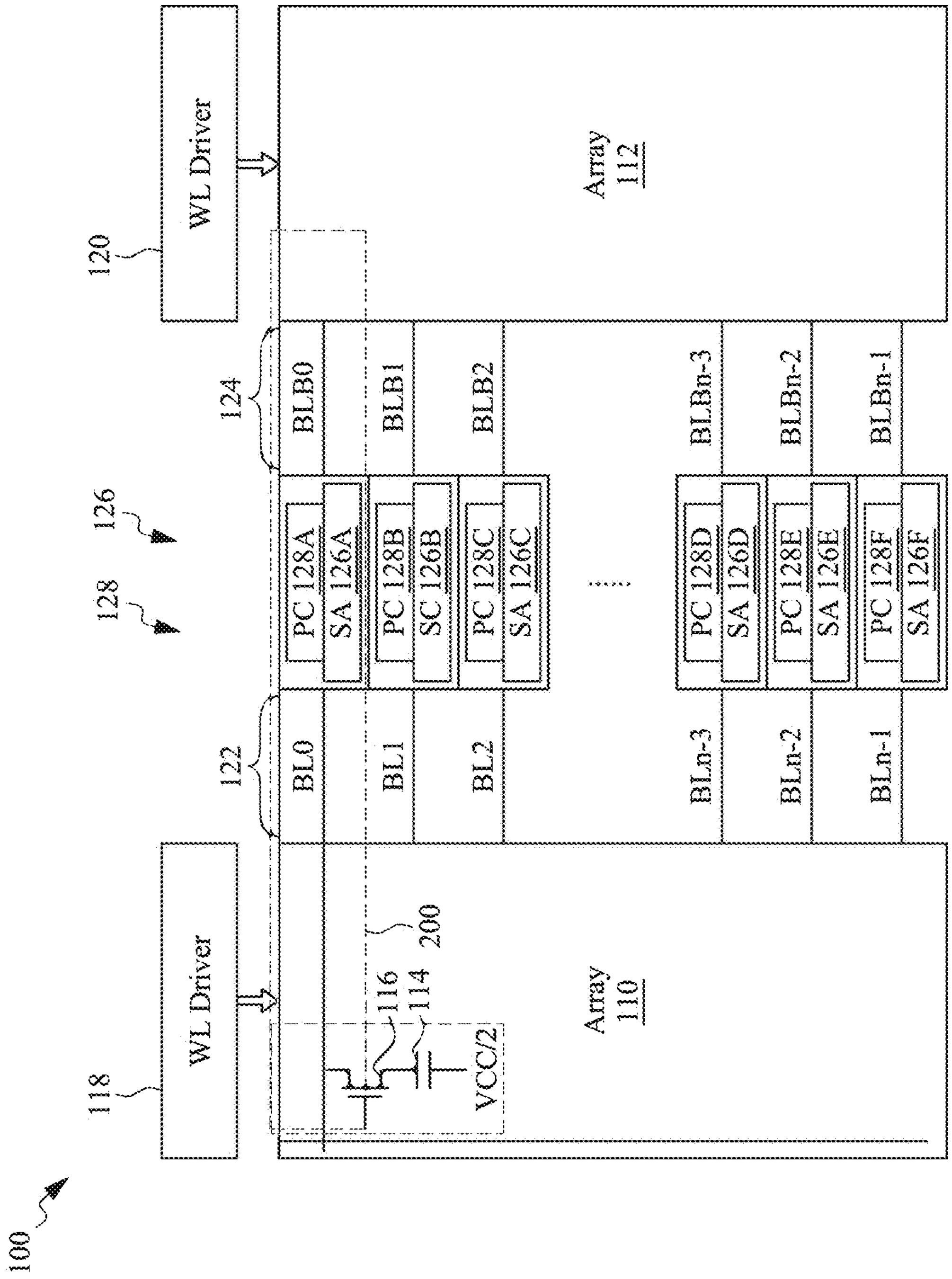
FIG. 1 illustrates a block diagram schematically illustrating an example memory device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Traditional 1T1C sensing amplifier devices include a precharge circuit with equalizer transistors. The gate terminals of the equalizer transistors connect to a single bit line equalizer signal. When developing for a read, the equalizer signal will disconnect the BL and BLB lines by turning off the precharge transistors. This enables the voltage level of the BL line to increase. As a result of the precharge transistors sharing a single precharge signal, the BL and BLB lines will suffer coupling noise once the bit lines are developed for a read. This noise affects the sensing amplifier's ability to sense the difference in voltage levels. In addition, the voltage level of the BL line and the voltage level of the BLB line begin to drift towards each other and gradually equalize. Accordingly, the above noise and equalization results in the sensing amplifier being unable to determine and amplify the voltage difference between the BL and BLB lines. Since voltage levels of both the BL line and the BLB line begin to drift towards each other, the sensing timeframe also quickly decreases, thus, affecting performance of the memory cell. Consequences of this equalization include the sensing amplifier being unable to determine a difference in the voltage levels of the BL line and the BLB line, thus, neither bit line is driven to a high or low state. The system is then unable to read a bit from the BL and BLB lines.

The present disclosure relates to a 1T1C sensing amplifier device. Disclosed examples enable reduced sensing noise and increase the timeframe for sensing the memory cell during a read. The device includes a bit line precharge signal and a reference bit line precharge signal separate from the bit line precharge signal. The BLB line can continue to charge by the precharge voltage even when the BL line is disconnected from the equalizer voltage. This maintained connection increases stability. Further, the BLB line can withstand noise by being continuously charged and not using a floating source voltage. By separating the BL line and the BLB line precharge signals, the BLB line can be maintained with the reference precharge circuit at the reference voltage level until the sensing amplifier switches to an on state. Accordingly, using the reference precharge circuit to maintain the BLB line at the reference voltage prevents the BLB line from equalizing towards the voltage level of the BL line. Preventing the voltage of the BLB line from equalizing with the voltage of the BL line increases the sensing time of the cell for the sensing amplifier to magnify the difference in voltage of the BL and BLB lines for a read operation.

FIG. 1 is a block diagram schematically illustrating example memory device 100. In the shown embodiment, the memory device 100 includes a BL array 110 and a BLB array 112. The BL array 110 includes an array of 1T1C memory cells 200, each of which have a capacitor 114 and a WL transistor 116 for each BL line. The BLB array 112 also includes an array of 1T1C memory cells, each of which also have a capacitor and transistor pair for each BLB line as shown in the BL array 110. Further, the BL array 110 receives input from a word line (WL) driver 118. The BLB array 112 receives input from the WL driver 120. In addition, the BL array 110 couples to the BL line 122, and the BLB array 112 couples to BLB lines 124. Each BL line of the BL line 122 couples to a corresponding BLB line through both a sensing amplifier circuit 126 (the sensing amplifier circuit 126 includes the sensing amplifier circuits 126A, 126B, 126C, 126D, 126E, and 126F; and "the sensing amplifier circuit 126" refers to any or all of the shown individual circuits, interchangeably) and a precharge circuit 128 (the precharge circuit 128 includes precharge circuits 128A, 128B, 128C, 128D, 128E, and 128F; and "the precharge circuit 128" refers to any or all of the shown individual circuits, interchangeably).

In this embodiment, the memory device 100 is used for storing data, such as for an external data bus. For example, a computer may use the memory device to store data. In some embodiments, the memory device is a DRAM unit. The DRAM cell can be used as an efficient memory unit for reading and writing data that a computer is currently processing. The computer may have the memory device 100 installed and operable for temporarily storing data. In some embodiments, a processor of the computer reads data from the memory device 100 in the form of instructions. The processor then causes the computer to perform certain functions.

The BL array 110 of the memory device 100 provides a plurality of memory cells and BL lines 122 for storing data. Each of the plurality of BL lines 122 connect to a corresponding transistor WL transistor 116 and a capacitor 114. The WL driver 118 actuates the corresponding WL transistor 116 for a row of cells to select that row. The capacitor 114 stores a charge indicating the stored bit for that cell. For example, if the capacitor stores a positive charge, then current will flow to the BL line to slightly increase the voltage of the BL line. If the capacitor stores a voltage less than the reference voltage level of the BL line, then current flows to the capacitor, thus, lowering the voltage level of the BL line. The BLB array 112 includes the same or similar components as the BL array 110 for controlling the voltage levels of the corresponding plurality of BLB lines 124.

The WL driver 118 and WL driver 120 select the row of cells corresponding to desired data. Further, the WL drivers 118 and 120 activate word lines to select rows of the memory device 110. The rows include a plurality of memory cells. Both the WL driver 118 and WL driver 120 supply sufficient voltage and current to change the state of the word lines quickly and reliably for reading and writing data. Once selected, the WL drivers 118 and 120 turn on the corresponding WL transistors 116 of each cell of the entire selected row. In some embodiments, the WL driver has a cross decoding (XDEC) architecture. Instead of directly driving every single word line, XDEC uses a hierarchical structure. A small number of primary decoders select a group of word lines. Secondary decoders, embedded within these groups, are then responsible for activating a specific word line within the selected group. The final activation of a word line happens at the intersection point ("cross-point") between a signal from the primary decoder and a signal from the secondary decode. In other embodiments, a different architecture for the WL drivers 118 and 120 are used.

Each of the BL lines connect to a complementary BLB line of the plurality of the BLB lines 124 through a corresponding sensing amplifier circuit 126 and a corresponding precharge circuit 128. The sensing amplifier circuit 126 is connected to the BL line 122 and BLB lines 124. It detects the minute voltage difference that appears during a read operation. The sensing amplifier circuit 126 rapidly amplifies this difference, resulting in a clear digital signal ('0' or '1') representing the data read from the cell. After the sense amplifier determines the data stored in the cell, it uses the amplified signal to drive the appropriate BL line 122, essentially recharging the capacitor 114. This process restores the data, ensuring a non-destructive read.

Before a read operation is performed, the precharge circuit 128 is configured to charge the corresponding coupled BL line 122 and BLB line 124 to a reference voltage. For example, if the high voltage level is five volts, then the reference voltage may be set to 2.5 volts. In some embodiments, the precharge circuit 128 is configured to disconnect from the BL line 122 and BLB line 124, respectively. This disconnection allows the BL line and BLB line to change voltage by connecting to respective capacitors, such as the capacitor 114. A voltage difference is then induced between the BL line 122 and the BLB line 124, which can be amplified and detected to read the stored bit of the cell by a coupled external bus. In some embodiments, the precharge circuit 128 is configured to disconnect from the BLB line 124 once the sensing amplifier circuit 126 is enabled.

Figure 2:
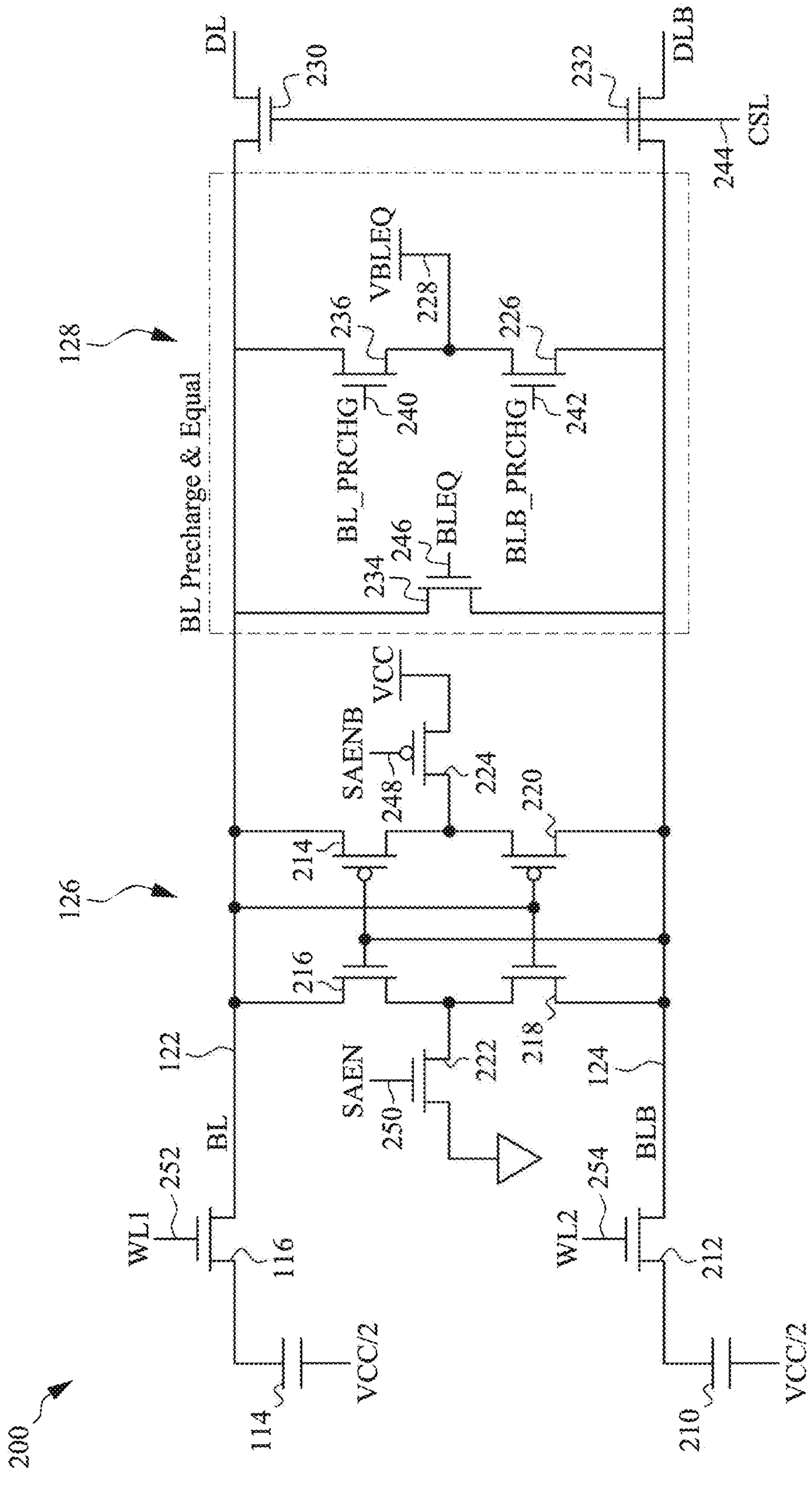
FIG. 2 illustrates a schematic diagram of a first example cell of the memory device of FIG. 1.

FIG. 2 illustrates a schematic diagram of a first example cell of the memory device 100 of FIG. 1. In the shown embodiment, the cell 200 includes a BL line 122 and a BLB line 124. The cell 200 includes the capacitor 114 connecting to a BL line 122 through the transistor 116. Further, a corresponding capacitor 210 connects through a WL transistor 212 to the BLB line 124. A gate of the WL transistor 212 receives a WL2 signal 254. The sensing amplifier circuit 126 also connects to both the BL line 122 and the BLB line 124. Further, the precharge circuit 128 connects to the BL line 122 and the BLB line 124. The sensing amplifier includes transistor 216, transistor 214, transistor 218, and the transistor 220 to form cross-coupled inverters. The precharge circuit includes equalizer transistor 234, transistor 226, and a transistor 236. Further, the cell 200 includes a column select transistor 230 and a column select transistor 232.

In this embodiment, the capacitors 114 and 210 store charge that result in complementary bits. For example, the capacitor 114 may store a positive charge to cause the BL line 122 to increase in voltage to represent a "1" bit value, while the capacitor 210 stores a negative charge (i.e., lower voltage) to cause the BLB line 124 to decrease in voltage to represent a "0" bit value. The WL transistor 116 and 212 are configured to receive a signal from the WL driver 118 and 120, respectively, to turn on and connect the capacitors 114 and 210 to the BL line 122 and the BLB line 124, respectively. In some embodiments, the WL transistor 116 and 212 are NMOS transistors. In other embodiments, the WL transistors 116 and 212 are different transistors, such as the WL transistor 116 being a NMOS transistor and the WL transistor 212 is a PMOS transistor. In some embodiments, the WL transistors 116 and 212 are different types of transistors.

The sensing amplifier circuit 126 includes cross-coupled inverters that are configured to detect a voltage difference between the BL line 122 and the BLB line 124. Further, the sensing amplifier amplifies this difference so that the BL line 122 is driven to a respective high or low state, while the BLB line 124 is conversely driven to the other state. For example, if the BL line 122 had a slightly higher voltage from being connected to the capacitor 114, then it will be driven to a high state and the BLB line 124 will be driven to a low state. The high state may be approximately 5 volts while the low state is approximately 0 volts. To enable the sensing amplifier, the transistor 222 receives a SAEN signal 250 to connect the junction between the transistor 216 and 218 to ground. The complementary signal SAENB 248 turns on the transistor 224. The transistor 224 connects the junction between the transistors 214 and 220 to a voltage supply signal VCC. In this embodiment, the transistors 216, 218, and 222 are NMOS and the transistors 214, 220, 224 are PMOS. In other embodiments, the transistors are different types of transistors.

The precharge circuit 128 provides precharge capabilities to the BL line 122 and the BLB line 124. In the shown embodiment, the precharge circuit 128 includes the equalizer transistor 234, the transistor 236, and the transistor 226. In some embodiments, the precharge circuit 128 includes other devices.

The equalizer transistor 234 includes a first source/drain terminal connected to the BL line 122 and a second source/drain terminal connected to the BLB line 124. As used herein, source/drain terminal(s) may refer to a source or a drain, individually or collectively dependent upon the context. The gate of the equalizer transistor 234 receives a BLEQ signal 246. During precharge, the equalizer transistor 234 turns on to couple the BL line 122 with the BLB line 124. This connection through the equalizer transistor 234 balances the BL line 122 and the BLB line 124 to the reference voltage. Once a read operation is to be performed and the precharge circuits turned off, the BLEQ signal 246 transitions to a low state, for the embodiment the equalizer transistor is an NMOS, the equalizer transistor 234 turns off disconnecting the BL line 122 and the BLB line 124.

The transistor 236 and transistor 226 connect the BL line 122 and the BLB line 124 to a VBLEQ signal 228, which is produced by a VBLEQ source. The VBLEQ signal 228 charges the BL line 122 and the BLB line 124 to the VBLEQ signal 228 when connected. The precharge circuit 128 use the transistor 236 and the transistor 226 to precharge the BL line 122 and the BLB line 124 while the WL drivers 118 and 120 are switched off. In some embodiments, precharging the BL line 122 and the BLB line 124 before a read operation improves the read time, improves signal integrity, reduces the complexity of the sense amplifier, and reduces the leakage effects between the bit lines. In addition, the transistors 236 receives the BL PRCHG signal 240 and the transistor 226 receives the BLB_PRCHG signal 242. In this embodiment, the BL_PRCHG signal 240 and the BLB_PRCHG signal 242 are separate signals as opposed to being a shared signal. Further, the BLB_PRCHG signal 242 is maintained in a high state to keep the BLB line 124 connected to the VBLEQ signal 228 until the SAEN signal 250 voltage signal turns on the transistor 222. These features avoid the voltage level of the BL line 122 from being shifted and slowly converging to the voltage level of the BLB line 124 since the BLB line 124 is maintained at the precharge voltage for a longer period than the BL line 122 and the BL_PRCHG signal 240 and the BLB_PRCHG signal 242 are decoupled.

The column select transistors 230 and 232 include gates that are coupled to the CSL signal 244. The CSL signal 244 operates the column select transistor 230 and the column select transistor 232. During a read operation, once the BL line 122 and BLB line 124 are fully charged to respective voltages for a read operation, the CSL signal 244 switches to a high state to turn on the column select transistors 230 and 232. Current then flows through the column select transistors 230 and 232 to an external device that receives the data bit information of the cell 200. The voltage difference between the BL line 122 and the BLB line 124 is amplified by the sensing amplifier circuit 126, thus, resulting in an efficient read of the cell 200 since the voltages between the BL line 122 and the BLB line 124 can be easily compared. In some embodiments, this embodiment of the precharge circuit 128 with the NMOS transistors may be used when the operating voltage of the BL line 122 and BLB line 124 is closer to ground as opposed to Vcc.

Figure 3:
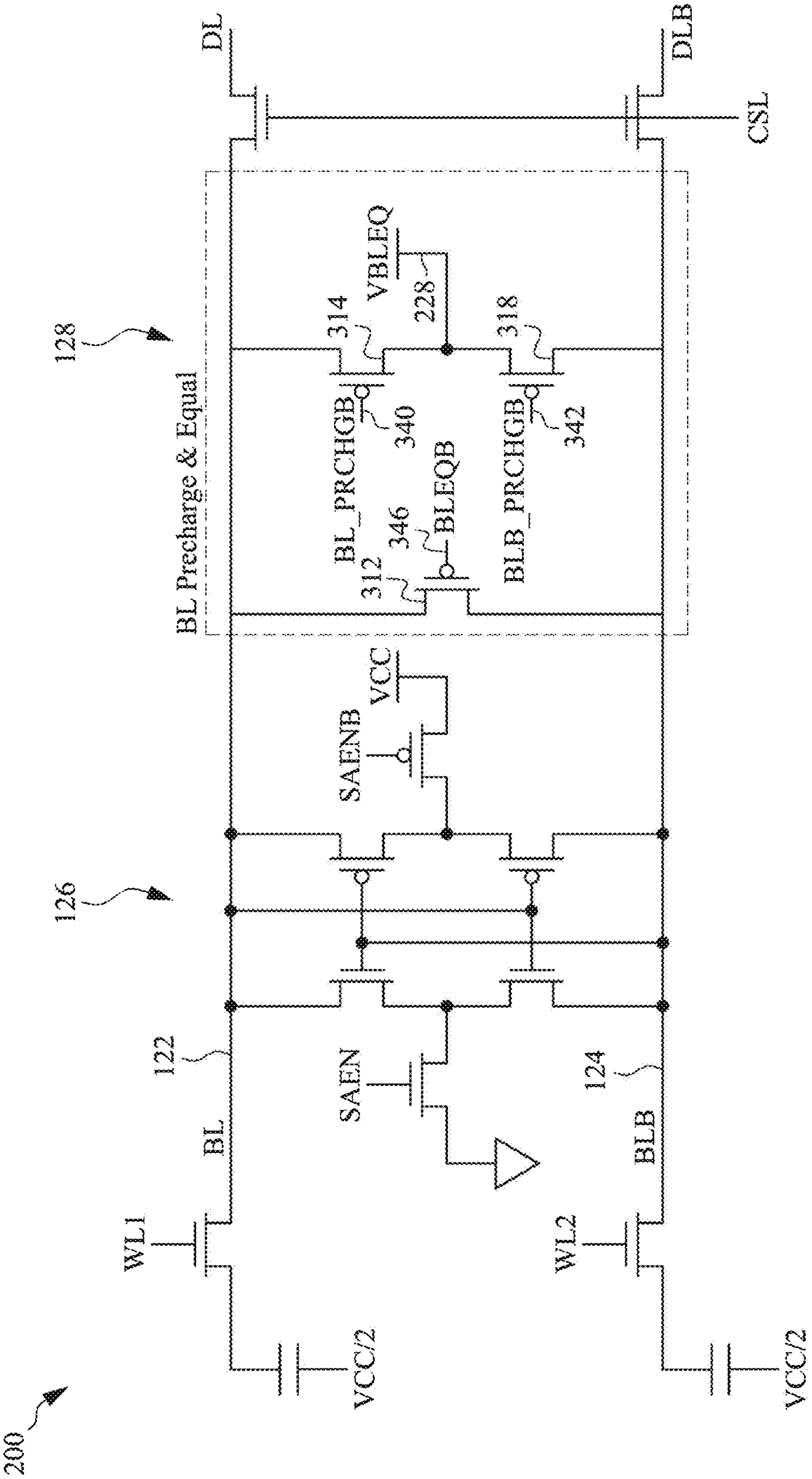
FIG. 3 illustrates a schematic diagram of a second example cell of the memory device of FIG. 1.

FIG. 3 illustrates a schematic diagram of a second example cell of the memory device 100 of FIG. 1. In this embodiment, the precharge circuit 128 includes PMOS transistors for an equalizer transistor 312, a transistor 314, and a transistor 318. The equalizer transistor 312 receives an BLEQB signal 346. The transistor 314 receives the BL_PRCHGB signal 340. The transistor 318 receives BLB_PRCHGB signal 342.

Here, this embodiment of the cell 200 operates the same or similarly to the cell 200 of FIG. 2, however, the precharge circuit 128 includes the PMOS transistor 314 instead of the NMOS transistor 236, the PMOS transistor 318 instead of the NMOS transistor 226, and the PMOS equalizer transistor 312 instead of the NMOS equalizer transistor 234. Accordingly, the transistor 314, 318, and the equalizer transistor 312 turn on and allow current to flow once the corresponding signal switches from a high state to a low state. For example, BLEQB signal 346, switches from a high state to a low state, the equalizer transistor 312 connects the BL line 122 to the BLB line 124 so they are at the same voltage. In addition, the BL_PRCHGB signal 340, the BLB_PRCHGB signal 342, and the BLEQB signal 346 may be inverses of the BL_PRCHG signal 240, the BLB_PRCHG signal 242, and the BLEQ signal 246. Otherwise, the transistors 314, 318, and the equalizer transistor 312 operate in the same or similar way as the transistors 236, 226, and the equalizer transistor 234. In some embodiments, this embodiment of the precharge circuit 128 including PMOS transistors may be used for a higher operating voltage of the BL line 122 and the BLB line 124, such as when the operating voltage is closer to Vcc.

Figure 4:
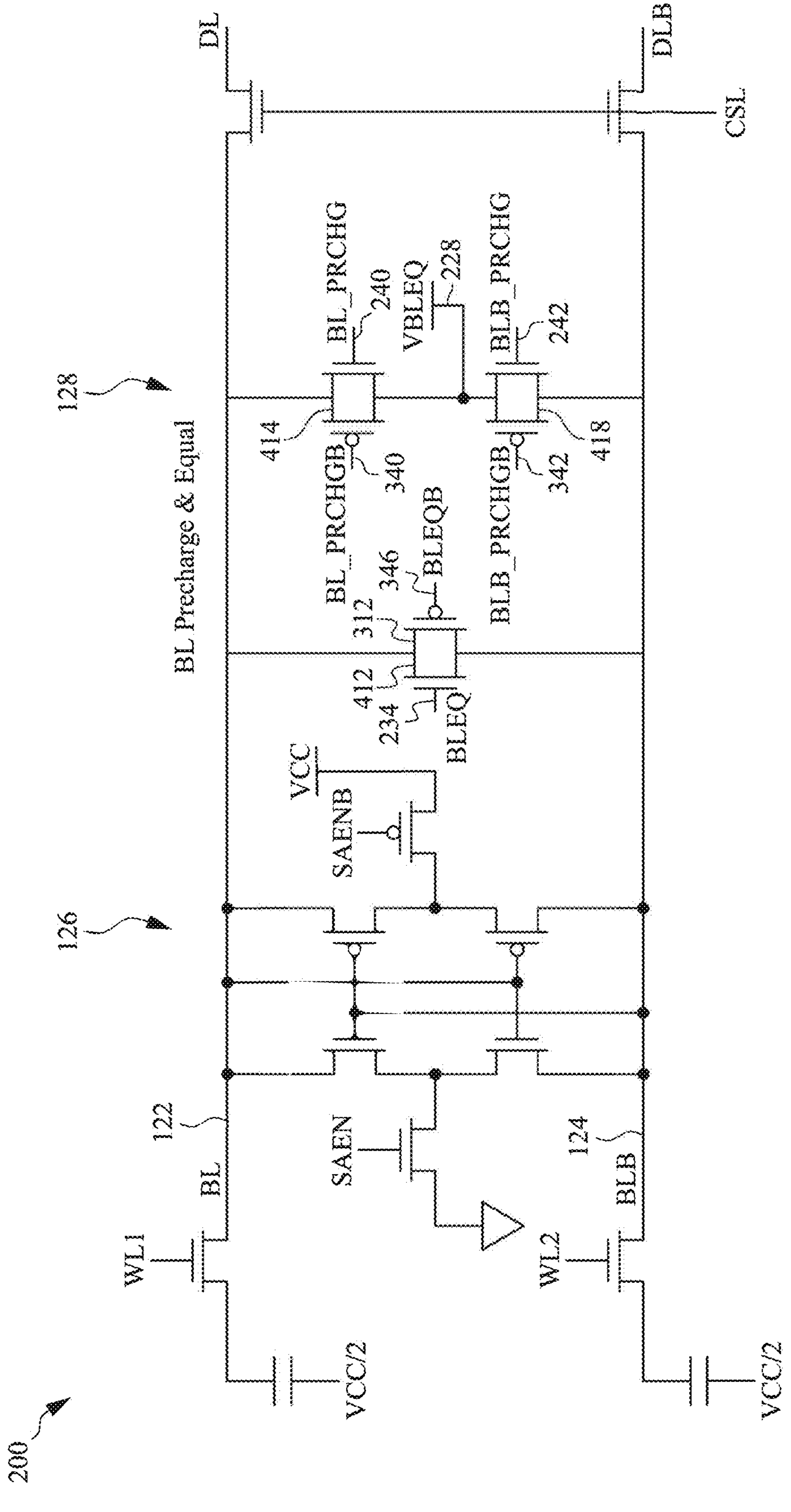
FIG. 4 illustrates a schematic diagram of a third example cell of the memory device of FIG. 1.

FIG. 4 illustrates a schematic diagram of a third example cell 200 of the memory device 100 of FIG. 1. The precharge circuit 128 includes transmission gate 412, transmission gate 414, and transmission gate 418. The transmission gate 412 receives both the BLEQ signal 234 and the BLEQB signal 346. The transmission gate 414 receives both the BL_PRCHG signal 240 and the BL_PRCHGB signal 340. The transmission gate 418 receives the BLB_PRCHG signal 242 and the BLB_PRCHGB signal 342.

In this embodiment, a transmission gate is used to instead of a single transistor. A transmission gate is a type of electronic switch used in circuits. It can be controlled digitally to either pass or block an analog or digital signal. Transmission gates are typically built using CMOS (Complementary Metal-Oxide-Semiconductor) technology, combining both PMOS and NMOS transistors The state of the transmission gate (open or closed) is determined by a digital control signal.

Using the transmission gate results in more stable connection and less leakage. For example, the transmission gate receives the BL_PRCHG signal 240 at an NMOS transistor and the inverse signal BL_PRCHGB signal 340 at a PMOS transistor. Since they are complementary signals, both transistors turn on at the same time allowing for a stable path for current to flow through the transmission gate 414. The same or similar principles apply to the transmission gate 412 and the transmission gate 418. For example, this embodiment of the precharge circuit 128 may be used for applications that use a full voltage range between Vcc to ground for the BL line 122 and the BLB line 124.

Figure 5:
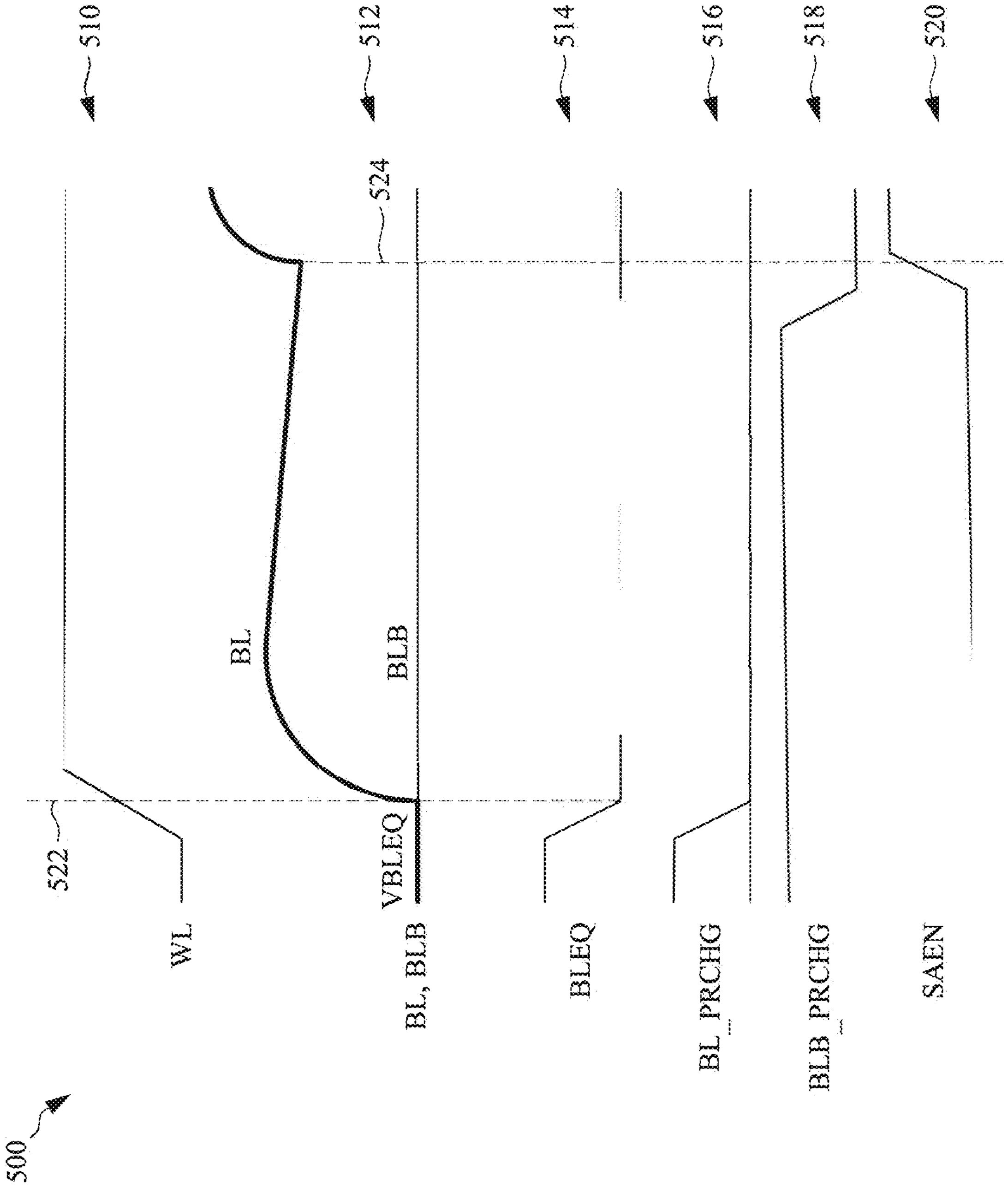
FIG. 5 illustrates an example timing diagram of the first example cell of FIG. 2 in accordance with some embodiments.

FIG. 5 illustrates an example timing diagram 500 of the first, second, or third example cells in accordance with some embodiments. The example timing diagram 500 includes a graph 510 of a WL signal, a graph 512 of a bit line signal, a graph 514 of an equalizer signal, a graph 516 of a BL precharge signal, a graph 518 of a BLB precharge signal, and a graph 520 of a sensing amplifier signal.

In this embodiment, an example operation of the cell 200 with the precharge circuit 128 is shown. When the WL signal 252 is at a low state, the BL and BLB signals are at a reference voltage VBLEQ signal 228. The BLEQ signal 246 is at a high state to balance the voltage between the BL line 122 and the BLB line 124. Further, both the BL_PRCHG signal 240 and the BLB_PRCHG signal 242 are at a high state to connect the BL line 122 and the BLB line 124 to the VBLEQ signal 228 through the transistor 236 and the transistor 226, respectively. The SAEN signal 250 is in a low state.

Once the WL signal 252 switches to a high state, the WL signal 252 edge occurs at the time 522. At time 522, the BLEQ signal 246 switches to a low state as shown in the graph 514, turning off the equalizer transistor 234. The BL_PRCHG signal 242 switches to a low state as well. As a result, the BL voltage level of the BL line 122 rises to the level of the capacitor 114. In this embodiment, the voltage level is Vcc/2. The voltage level of the BLB line 124 remains at the VBLEQ signal 228 level since the BLB_PRCHG signal 242 remains connected to the BLB line 124.

At a time 524, the BLB_PRCHG signal 242 switches to a low state at the SAEN signal switches to a high state, thus, turning on the sensing amplifier circuit 126. The difference between the voltage levels of the BL line 122 and the BLB line 124 amplifies as a result, which can be seen in the graph 512. An external device, such as a connected multiplexer, can then perform a read operation on the BL line 122 and the BLB line 124.

Figure 6:
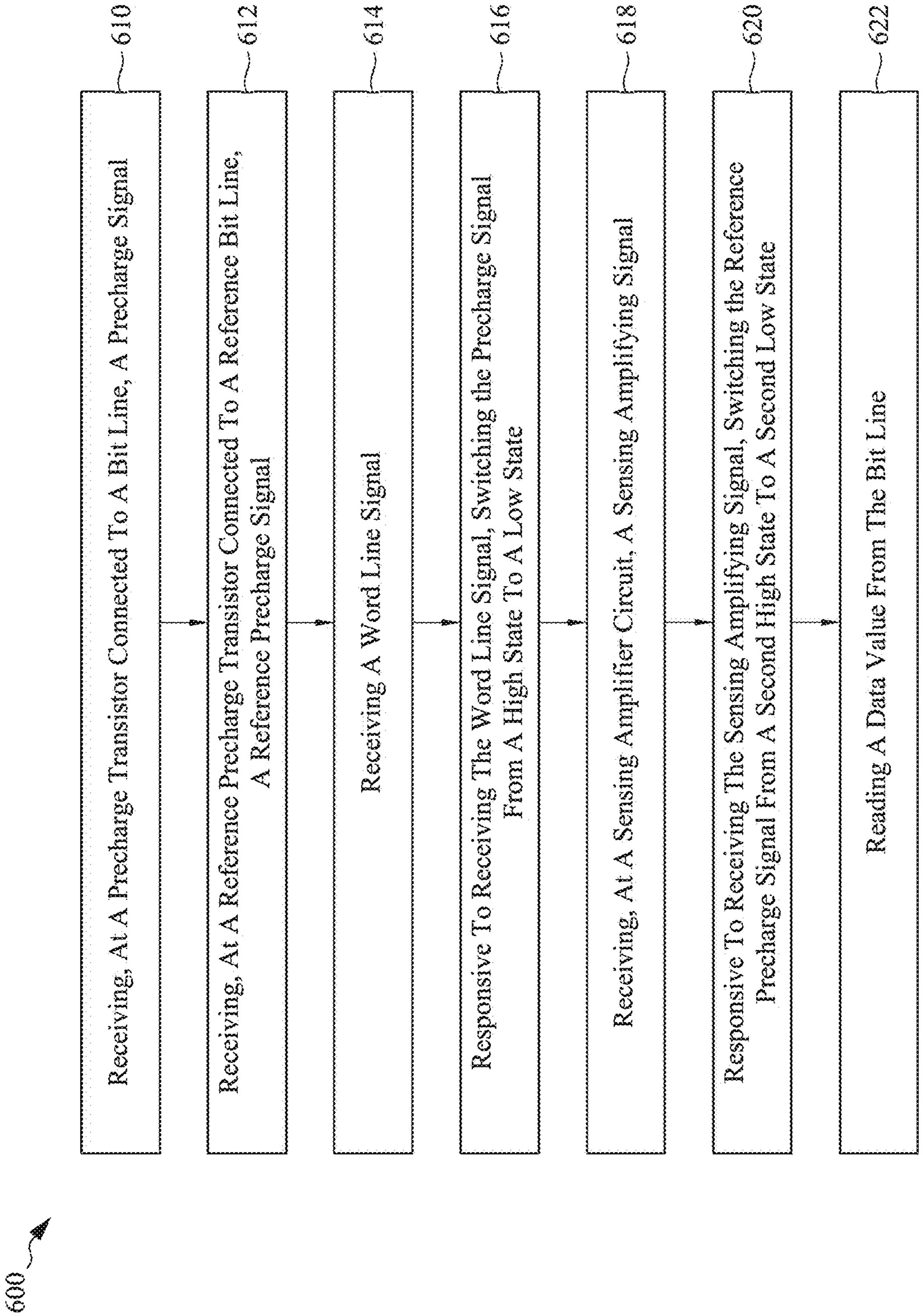
FIG. 6 illustrates an example flow diagram for performing a read operation using the memory cell of FIG. 1 in accordance with some embodiments.

FIG. 6 illustrates an example flow diagram for performing a read operation using the memory device of FIG. 1 in accordance with some embodiments. A shown method 600 includes operations 610-622 for performing a read operation of one of the previously discussed embodiments of the cell used in the plurality of memory cells 100. For example, the cell may be the cell 200.

At an operation 610, a precharge signal is received by a precharge transistor connected to a bit line. The precharge transistor turns on responsive to receiving the precharge signal. Once turned on, the precharge transistor connects the bit line to a reference voltage input terminal.

At an operation 612, a reference precharge signal is received by a reference precharge transistor connected to a reference bit line. The reference precharge transistor turns on responsive to receiving the reference precharge signal. Further, the reference precharge signal is separate from the precharge signal. Once turned on, the reference precharge transistor connects the reference bit line to the reference voltage input terminal.

Proceeding to an operation 614, a word line signal is received. The word line signal may be received by a word line transistor that connects a capacitor to the bit line. Further, the bit line is charged by the capacitor responsive to the word line transistor receiving the word line signal. In some embodiments, a second word line transistor also receives a second word line signal. The second transistor connects the reference bit line to a second capacitor. In some embodiments, the second word line is the same as the first word line. Responsive to the second transistor receiving the second word line, the reference bit line is charged by the second capacitor.

At operation 616, the precharge signal is switched from a high state to a low state. The high state and the low state may be referred to as a first high state and a first low state. The switching of the precharge signal is responsive to receiving the word line signal. The precharge transistor turns off responsive to the precharge signal switching to the low state. In some embodiments, the reference precharge signal remains connected to the reference precharge transistor, thus, the reference precharge transistor remains on.

At an operation 618, a sensing amplifier signal is received by a sensing amplifier circuit. The sensing amplifier circuit is connected to the bit line and the reference bit line. Responsive to receiving the sensing amplifier signal, the sensing amplifier circuit amplifies a difference between the bit line and the reference bit line. In some embodiments, the sensing amplifying signal is received after the word line signal.

At operation 620, the reference precharge signal is switched from a high state to a low state. The high state and low state of the reference precharge signal may be referred to as a second high state and a second low state. The switch to the low state is responsive to receiving the sensing amplifying signal. The reference precharge transistor turns off responsive to the reference precharge signal switching to the low state. In some embodiments, the reference precharge signal switches from a second high state to a second low state. In some embodiments, the second high state is the same as the high state of the precharge signal, and the second low state is the same as the low state of the precharge signal. In some embodiments, the states differ.

At operation 622, a data value is read from the bit line. In some embodiments, a connected memory device, processor, register, or other device is coupled to the bit line and performs the read operation. The value may be a “1” binary bit value or a “0” binary bit value depending on the detected voltage level of the bit line.

In one example, a memory device comprises a memory array including a memory cell, a bit line connected to an output terminal of the memory cell, a reference bit line, a sensing amplifier circuit coupled to the bit line and coupled to the reference bit line. The sensing amplifier circuit is configured to amplify a voltage difference between the bit line and the reference bit line. The memory device further comprises a precharge circuit coupled to the bit line and the reference bit line. The precharge circuit includes a bit line precharge switch configured to receive a first precharge signal, and a reference bit line precharge switch configured to receive a second precharge signal separate from the first precharge signal.

In further examples, a memory precharge circuit comprises a reference voltage input terminal configured to receive a first voltage level, a first transistor with a first source/drain terminal coupled to a bit line, a second source/drain terminal connected to the reference voltage input terminal, and a gate terminal configure to receive a first precharge signal, and a second transistor with a first source/drain terminal coupled to a reference bit line, a second source/drain terminal connected to the reference voltage input terminal, and a gate terminal configure to receive a second precharge signal. The second reference precharge signal being separate from the first precharge signal.

In still further examples, a method comprises receiving, at a precharge transistor connected to a bit line, a precharge signal, receiving, at a reference precharge transistor connected to a reference bit line, a reference precharge signal. The reference precharge signal is different from the precharge signal. The method further comprises receiving a word line signal, responsive to receiving the word line signal, disconnecting the precharge signal from the precharge transistor, receiving, at a sensing amplifier circuit, a sensing amplifying signal, responsive to receiving the sensing amplifying signal, disconnecting the reference precharge signal from the reference precharge transistor, and reading a data value from the bit line.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a memory array including a memory cell;

a bit line connected to an output terminal of the memory cell;

a reference bit line;

a sensing amplifier circuit coupled to the bit line and coupled to the reference bit line, the sensing amplifier circuit including;

a first sensing transistor with a gate configured to receive a sensing amplifying signal, the first sensing transistor including a terminal coupled between two NMOS transistors, and further including a second terminal connected to ground, and a second sensing transistor with a gate configured to receive a complementary sensing amplifying signal, the second sensing transistor including a terminal coupled between two PMOS transistors, and further including a second terminal connected to a voltage terminal, wherein one NMOS transistor of the two NMOS transistors is coupled to the bit line, a second NMOS transistor of the two NMOS transistors is coupled to the reference bit line, a first PMOS transistor of the two PMOS transistors is coupled to the bit line, and a second PMOS transistor of the two PMOS transistors is coupled to the reference bit line; and a precharge circuit coupled to the bit line and the reference bit line, the precharge circuit including:

a bit line precharge switch configured to receive a first precharge signal; and a reference bit line precharge switch configured to receive a second precharge signal separate from the first precharge signal.

2. The memory device of claim 1, wherein the bit line precharge switch is configured to connect the bit line to a reference voltage input terminal until a word line signal is received by a word line switch.

3. The memory device of claim 2, further comprising:

an equalizer transistor coupled to both the bit line and the reference bit line, wherein the equalizer transistor is configured to connect the bit line to the reference bit line responsive to receiving an equalizer signal at a gate of the equalizer transistor.

4. The memory device of claim 1, wherein:

the bit line precharge switch includes a first transistor with a first source/drain terminal coupled to the bit line, a second source/drain terminal connected to a reference voltage input terminal, and a gate terminal configured to receive the first precharge signal; and the reference bit line precharge switch includes a second transistor with a first source/drain terminal coupled to the reference bit line, a second source/drain terminal connected to the reference voltage input terminal, and a gate terminal configured to receive the second precharge signal.

5. The memory device of claim 4, wherein the first transistor and the second transistor are n-type.

6. The memory device of claim 1, further comprising:

a bit line capacitor connected to the bit line; and a reference bit line capacitor connected to the reference bit line.

7. A memory precharge circuit, comprising:

a reference voltage input terminal configured to receive a first voltage level;

a first transistor with a first source/drain terminal coupled to a bit line, a second source/drain terminal connected to the reference voltage input terminal, and a gate terminal configured to receive a first precharge signal;

a second transistor with a first source/drain terminal coupled to a reference bit line, a second source/drain terminal connected to the reference voltage input terminal, and a gate terminal configured to receive a second reference precharge signal, the second reference precharge signal separate from the first precharge signal;

a bit line capacitor connected to the bit line, wherein the bit line capacitor charges the bit line to a second voltage higher than the first voltage level; and a reference bit line capacitor connected to the reference bit line.

8. The memory precharge circuit of claim 7, wherein the second transistor is configured to disconnect the reference bit line from the reference voltage input terminal responsive to an amplifier transistor receiving a sensing amplifier signal.

9. The memory precharge circuit of claim 8, wherein the first transistor is configured to enable precharging of the bit line until a word line signal is enabled based on the first precharge signal.

10. The memory precharge circuit of claim 7, wherein the first transistor and the second transistor are n-type.

11. The memory precharge circuit of claim 7, further comprising:

a sensing amplifier coupled to the bit line and coupled to the reference bit line.

12. The memory precharge circuit of claim 11, wherein the second reference precharge signal being separate from the first precharge signal increases a sensing window of a difference between the bit line at the second voltage and the reference bit line at the first voltage level.

13. A method, comprising:

receiving, at a precharge transistor connected to a bit line, a precharge signal, wherein the precharge transistor connects the bit line to a first voltage level;

receiving, at a reference precharge transistor connected to a reference bit line, a reference precharge signal, the reference precharge signal at a higher voltage level than the precharge signal;

receiving a word line signal;

responsive to receiving the word line signal, switching the precharge signal from a first high state to a first low state;

receiving, at an equalizer transistor connecting the bit line to the reference bit line, an equalizer signal, the equalizer transistor caused to turn on responsive to receiving the equalizer signal; and responsive to receiving the word line signal, switching the equalizer signal from a third high state to a third low state;

receiving, at a sensing amplifier circuit, a sensing amplifying signal;

responsive to receiving the sensing amplifying signal, switching the reference precharge signal from a second high state to a second low state; and reading a data value from the bit line.

14. The method of claim 13, wherein the sensing amplifying signal is received after the word line signal.

15. The method of claim 13, wherein the word line signal is received by a word line transistor that connects a capacitor to the bit line, and wherein the bit line is charged by the capacitor responsive to the word line transistor receiving the word line signal.

16. The memory device of claim 1, wherein the output terminal of the memory cell includes a word line transistor configured to receive a word line signal.

17. The memory precharge circuit of claim 7, further comprising:

an equalizer transistor with a first source/drain terminal connected to the bit line and a second source/drain terminal connected to the reference bit line.

18. The memory precharge circuit of claim 17, wherein the equalizer transistor further includes a gate terminal configured to receive a signal that transitions to a low state based on a read operation being performed.

19. The memory precharge circuit of claim 17, wherein the equalizer transistor is an NMOS transistor.

20. The method of claim 13, further comprising:

charging, using a bit line capacitor, the bit line to a second voltage level higher than the first voltage level.

* * * * *